US007898804B2

(12) United States Patent
Olesiewicz et al.

(10) Patent No.: US 7,898,804 B2
(45) Date of Patent: Mar. 1, 2011

(54) AIR FLOW SNORKEL FOR COMPUTER SYSTEM

(75) Inventors: Timothy Olesiewicz, Dublin, CA (US); Anthony Eberhardt, Los Gatos, CA (US); Brett Ong, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 225 days.

(21) Appl. No.: 12/259,311

(22) Filed: Oct. 28, 2008

(65) Prior Publication Data

US 2010/0103606 A1    Apr. 29, 2010

(51) Int. Cl.
*H05K 7/20* (2006.01)

(52) U.S. Cl. .......................... 361/694; 361/695; 454/184

(58) Field of Classification Search ............ 361/679.46–679.49, 695; 454/184
See application file for complete search history.

(56) References Cited

U.S. PATENT DOCUMENTS

| 2,509,011 | A |   | 5/1950  | Moore |
|-----------|---|---|---------|-------|
| 4,315,300 | A |   | 2/1982  | Parmerlee et al. |
| 4,646,202 | A |   | 2/1987  | Hook et al. |
| 5,171,183 | A | * | 12/1992 | Pollard et al. ................. 454/184 |
| 5,963,425 | A |   | 10/1999 | Chrysler et al. |
| 6,169,658 | B1 |  | 1/2001  | Arena et al. |
| 6,305,180 | B1 |  | 10/2001 | Miller et al. |
| 6,504,718 | B2 | * | 1/2003  | Wu ................................. 361/695 |
| 6,525,935 | B2 | * | 2/2003  | Casebolt .................. 361/679.46 |
| 6,731,502 | B1 | * | 5/2004  | Hsu ............................... 361/695 |
| 6,807,056 | B2 |  | 10/2004 | Kondo et al. |
| 6,840,794 | B2 |  | 1/2005  | Chiu |
| 7,367,384 | B2 |  | 5/2008  | Madara et al. |
| 7,382,613 | B2 | * | 6/2008  | Vinson et al. ............ 361/679.48 |
| 7,436,663 | B2 | * | 10/2008 | Matsushima et al. ......... 361/695 |
| 2006/0019597 | A1 | * | 1/2006 | Beitelmal et al. ............. 454/184 |
| 2008/0060372 | A1 |   | 3/2008 | Hillis et al. |
| 2008/0144280 | A1 | * | 6/2008 | Walsh et al. .................. 361/694 |
| 2009/0061755 | A1 | * | 3/2009 | Calder et al. .................. 454/184 |

FOREIGN PATENT DOCUMENTS

WO    2007/082351 A1    7/2007

* cited by examiner

*Primary Examiner* — Gregory D Thompson
(74) *Attorney, Agent, or Firm* — Brooks Kushman P.C.

(57) ABSTRACT

A vent for a computer apparatus having first and second groups of components. The vent has an air inlet that receives air from a location adjacent to the first group of components and an air outlet that provides air into a space defined between the first and second components. Air flows from the air inlet to the air outlet through a channel that circumvents the first group of components. The computer apparatus may be a server having a plurality of disk drives disposed in a front section of a cabinet. A fan in the back section of the cabinet draws air through a first airflow path across the disk drives. A snorkel defines a second airflow path that circumvents the disk drives in the front section to provide air to the second group of components in the back section.

13 Claims, 2 Drawing Sheets

AIR FLOW SNORKEL FOR COMPUTER SYSTEM

BACKGROUND OF THE INVENTION

1. Field of the Invention

The present invention relates to ventilation systems for computer equipment.

2. Background Art

Computer systems require cooling to maintain maximum performance and system reliability. Servers are one example of a computer system that requires a cooling system to cool disk drives, circuit board mounted components, power supplies, and the like. Disk drives have servo motors for rapidly spinning data disks that are scanned by moving heads. Drive motors and other movable components are heated in the course of normal operation of the disk drive. Microcircuit chips, memory devices, resistors and other components mounted on circuit boards also develop heat during normal operation.

Build-up of heat in microcircuit chips reduces the capacity and otherwise limits performance of the computer system. Substantial energy is required to operate disk drives and their associated circuit boards. Energy is lost to heat and dissipation of heat also requires energy that adds to the cost of operation of the computer system.

A server is one example of such a computer system that requires an efficient and effective cooling system. Some server systems have disk drives that are located in a front section of a cabinet. Fans, circuit boards and power supplies are assembled in a back section of the server. Disk drives may be cooled by air flowing from the front of the server to the back of the server. Air flowing from the front is heated by disk drives which reduces the cooling capacity of the air that is available to cool components in the back section of the server. In addition, closely spaced disk drives impede air flow and further reduce available air flow for cooling the circuit boards and power supplies of the server system.

The present invention is directed to solving the above problems as summarized below.

SUMMARY OF THE INVENTION

According to one aspect of the invention, a vent is provided for a computer apparatus having a first group of components and a second group of components. The vent comprises an air inlet, an air outlet and a channel. The air inlet receives ambient air. The air outlet provides air into a space defined between the first and second groups of components. Air flows from the air inlet to the air outlet through the channel and thereby circumvents the first group of components.

According to other aspects of the invention, the computer apparatus may be a server with the first group of components being a plurality of disks and the second group of components including one or more of a fan, a circuit board, and a power supply. The inlet may be disposed adjacent to the front of the server, and the outlet functions to direct air flow through an opening in a chassis of the server that is disposed behind the disk drives.

In one embodiment, the channel is open on one side and attached to a side rail of a chassis that spans the one side and that supports the first and second components of the computer system. In another embodiment, the channel is a tubular member that is attached to a side rail of a chassis that supports the first and second components. In either embodiment, the channel is preferably sealed to prevent air leakage between the channel and the first components. In addition, a filter may be provided within the channel that filters air flowing through the channel.

According to another aspect of the invention, a computer server is provided that includes a plurality of disk drives disposed in a front section of a cabinet and at least one fan disposed in a back section of the cabinet that draws air through a first air flow path across the disk drives in the front section. A snorkel defines a second air flow path that circumvents the front section and provides air to the back section.

The snorkel may have an inlet disposed adjacent to the front of the server and an outlet that functions to direct air flow through an opening in a chassis between the front section and the back section.

In one embodiment, the snorkel is open on one side and attached to a side rail of a chassis that spans the one side and that supports the front and back sections of the computer server. In another embodiment, the snorkel is a tubular member that is attached to a side rail of a chassis that supports the front and back sections of the computer server. In either embodiment, the snorkel is sealed to prevent air leakage between the snorkel and the plurality of disk drives. A filter may be provided within the snorkel to filter air flowing through the snorkel.

These and other aspects of the present invention will be more fully understood in view of the attached drawings and in light of the detailed description of the illustrated embodiments below.

DETAILED DESCRIPTION OF THE PREFERRED EMBODIMENT(S)

Figure 1:
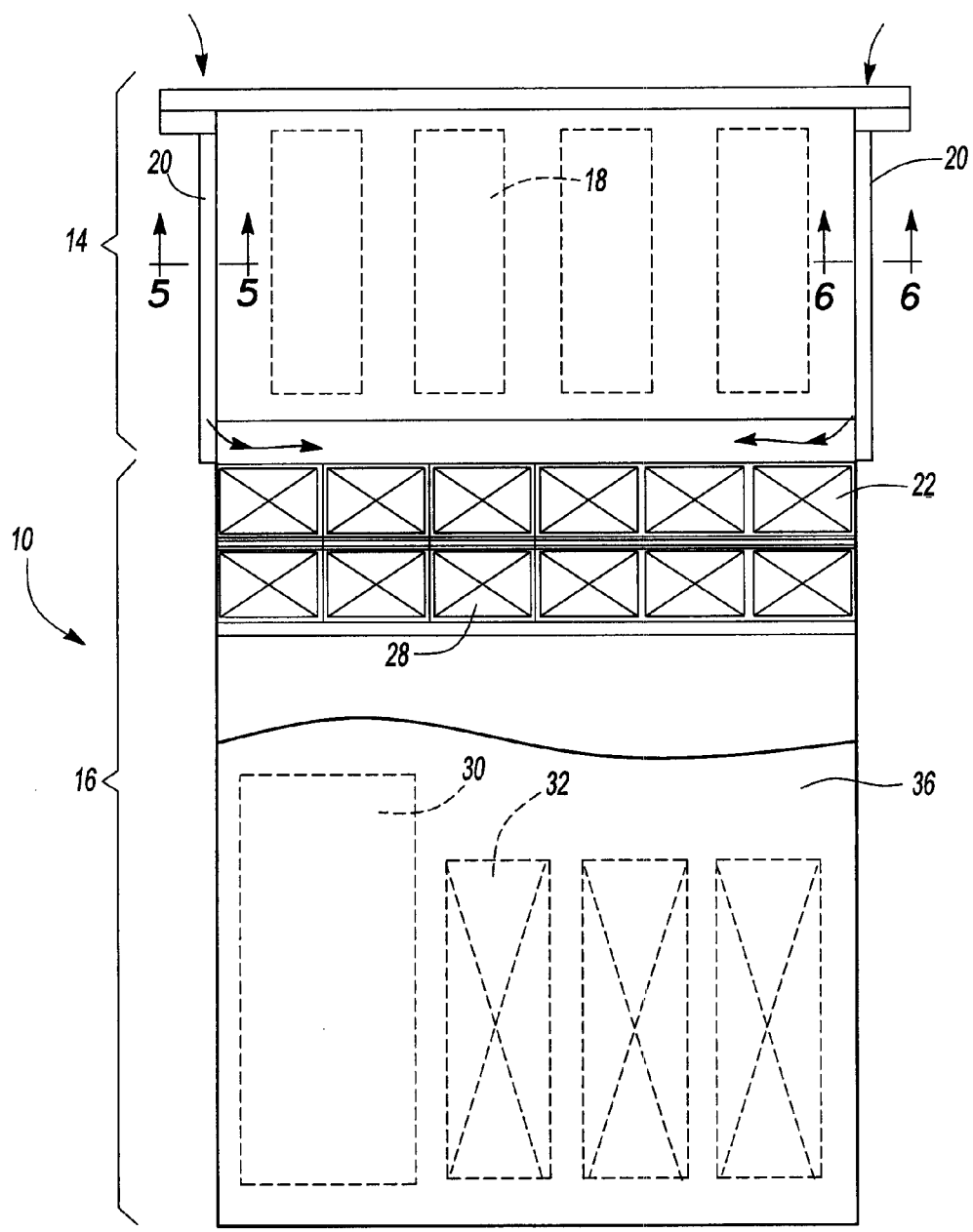
FIG. 1 is diagrammatic top plan view of a computer system, such as a server, that is shown with the illustrated embodiment of an air flow snorkel.

Referring to FIG. 1, a computer system 10, such as a server, is diagrammatically illustrated in a top plan view. The computer system 10 includes a front section 14 and a back section 16. In the server application, the front section 14 houses a plurality of disk drives 18, or tape drives, that are used to store data as is well known in the art.

A pair of snorkels 20 are provided on opposite sides of the front section 14 of the computer system 10. The snorkels 20 provide a channel through which air may be provided to a space 22, or plenum, defined between the disk drives 18 in the front section 14 and the back section 16 of the computer system 10.

A plurality of fans are provided in the back section 16 to draw air into the back section 16. The fans 28 are shown in two rows at the forward end of the back section 16. Alternatively, the fans may be provided at the rearward end of the of the back section 16.

One or more power supplies 30 are also preferably provided in the back section 16. In addition several circuit boards 32 may also be provided in the back section 16. The circuit boards 32 include integrated circuits and memory devices that require cooling for efficient and optimal operation. Likewise, the power supply 30 should be cooled to protect the power supply 30 from overheating. The computer system 10 components including the disk drives 18, the fans 28, the power supplies 30 and the circuit boards 32 are assembled to a rack or cabinet shelf 36 that supports computer system components according to the design of the server.

Figure 2:
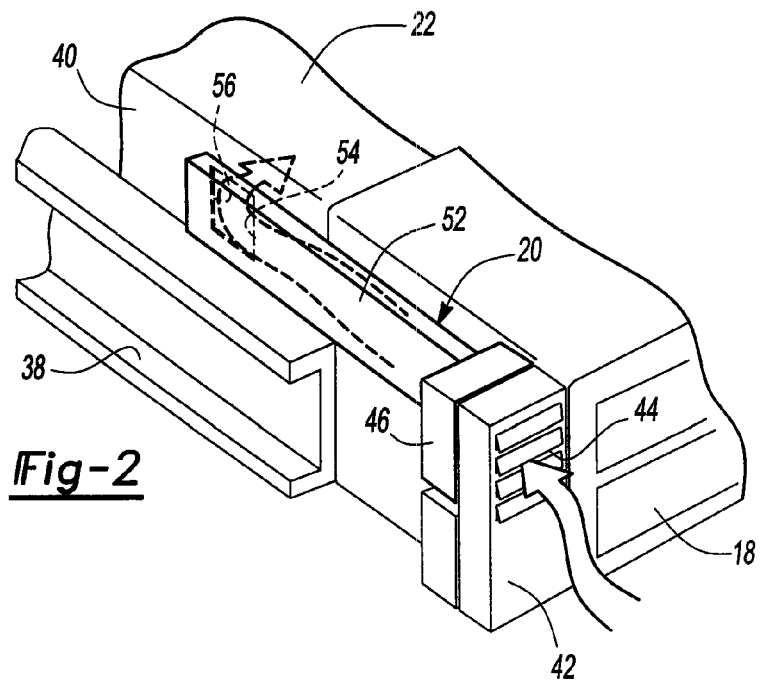
FIG. 2 is a fragmentary perspective view of the computer system having the air flow snorkel made in accordance with the disclosed embodiment.
Figure 3:
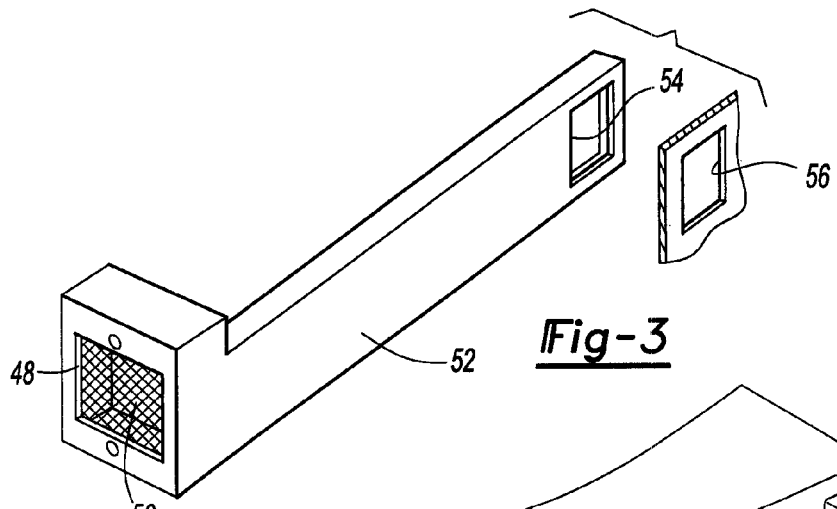
FIG. 3 is a perspective view of an airflow snorkel shown detached from the side of a computer system chassis.
Figure 4:
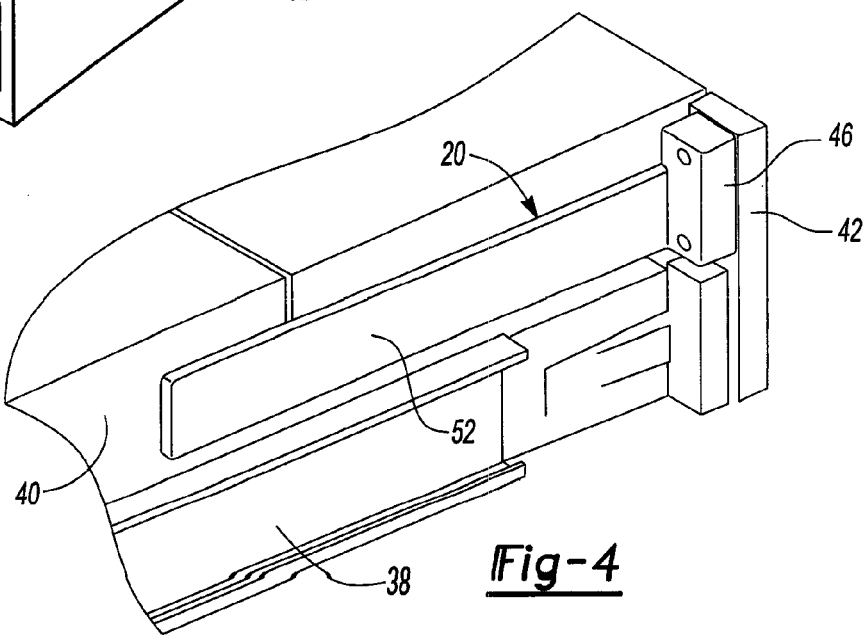
FIG. 4 is a fragmentary perspective view showing the air flow snorkel attached to the chassis of the computer system.

Referring to FIGS. 2-4, the snorkel 20 will be described in greater detail. The snorkel 20 is shown secured about a side rail 38 on the chassis 40 of the computer system 10. The computer system includes a front bezel 42 which provides a facade for the snorkel 20 and disk drive 18. An air inlet 44 is provided as part of the front bezel 42.

The snorkel 20 includes an inlet housing portion 46 that defines a snorkel inlet opening 48. An air filter 50, shown in FIG. 3, may be provided within the inlet housing portion 46 or anywhere along the length of the passageway defined by the snorkel 20. An airflow passage 52 is provided to direct air from the air inlet 44 through the inlet housing portion 46 to a snorkel outlet opening 54. Air flow passage 52 allows air to flow from the inlet opening 44 to the outlet opening 54, and through an opening 56 defined in the chassis 40. Cool ambient air is provided through snorkel 20 to the plenum 22 thereby circumventing the disk drives 18 in the front section 14.

Figure 5:
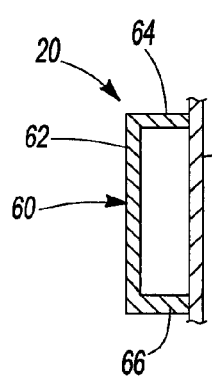
FIG. 5 is a cross-sectional view taken along the line 5-5 in FIG. 1.

Referring to FIG. 5, the snorkel 20 is shown to be formed as an open sided channel that is closed by being assembled against the chassis 40. The channel 60 includes a sidewall 62, a top wall 64 and a bottom wall 66.

Figure 6:
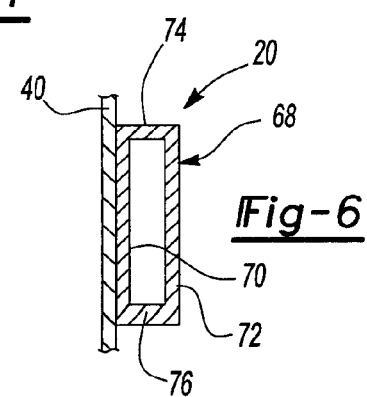
FIG. 6 is a cross-sectional view taken along the line 6-6 in FIG. 1.

Referring to FIG. 6, an alternative embodiment of the snorkel 20 is shown that is formed as a tube 68. The tube 68 is assembled to the chassis 40 with an inside wall 70 being glued, fastened or otherwise secured to the chassis 40. The tube 68 also includes an outer wall 72, a top wall 74 and a bottom wall 76.

While different embodiments of the snorkel 20 are shown in FIGS. 5 and 6 on opposite sides of the computer system 10 in FIG. 1, it is expected that in most instances a single embodiment of the snorkel 20 will be used that will be of the same design on both sides of the computer system.

While this invention has been described with reference to a server 10, it should be understood that other computer systems requiring supplemental air supply for cooling purposes could advantageously incorporate the snorkel. The snorkel provides supplemental cooling air that has not been preheated by passing across heated components of the computer system.

The snorkel 20 preferably defines a sealed airflow passage from the source of ambient air in front of the front bezel 42 of the computer system 10 and then provides the air to a space behind a component of the computer system such as the disk drive or tape drive. With this approach, restrictions of airflow caused by components in the front section 14 of the computer system 10 do not impede airflow for the other components of the system in the back section 16. In addition, the air supplied through the snorkel 20 is ambient air that is not preheated prior to being delivered to the back section 16 of the computer system 10. The air provided through the snorkel may be provided either through the filter 50 or without the filter 50.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A vent for a server having a first group of components and a second group of components, the vent comprising:
   an air inlet disposed adjacent to the front of the server that receives air from a location adjacent to the first group of components;
   an air outlet that directs air flow through an opening in a chassis of the server into a space defined between the first and second group of components that is disposed behind the first group of components; and
   a channel through which air flows from the air inlet to the air outlet that circumvents the first group of components.

2. The vent of claim 1 wherein the server and the first group of components are a plurality of disks and the second group of components includes one or more of a fan, a circuit board, and a power supply.

3. The vent of claim 1 wherein the server includes a plurality of disk drives disposed in the front of the server and further wherein the first group of components is the plurality of disk drives.

4. The vent of claim 1 further comprising a filter that is provided in the channel which filters air flowing through the channel.

5. The vent of claim 1 wherein the channel is sealed to prevent air leakage between the channel and the first group of components.

6. A vent for a computer apparatus having a first group of components and a second group of components, the vent comprising:
   an air inlet that receives air from a location adjacent to the first group of components;
   an air outlet that provides air into a space defined between the first and second group of components; and
   a channel through which air flows from the air inlet to the air outlet that circumvents the first group of components, wherein the channel is open on one side and attached to a side rail of a chassis that spans the one side and that supports the first and second components of the computer system.

7. A vent for a computer apparatus having a first group of components and a second group of components, the vent comprising:
   an air inlet that receives air from a location adjacent to the first group of components;
   an air outlet that provides air into a space defined between the first and second group of components; and
   a channel through which air flows from the air inlet to the air outlet that circumvents the first group of components, wherein the channel is a tubular member that is attached to a side rail of a chassis that supports the first and second components.

8. A computer server apparatus comprising:
   a plurality of disk drives disposed in a front section of a cabinet;
   a fan disposed in a back section of the cabinet that draws air through a first air flow path across the disk drives in the front section;
   a snorkel defining a second air flow path circumventing the front section and providing air to the back section, wherein the snorkel further comprises an inlet disposed adjacent to the front section, and an outlet that directs air flow through an opening in a chassis of the server that is disposed between the front section and the back section.

9. The computer server apparatus of claim 8 further comprising a circuit board, and a power supply disposed in the back section of the cabinet.

10. The computer server apparatus of claim 8 further comprising a filter that is provided in the snorkel that filters air flowing through the snorkel.

11. The computer server apparatus of claim 8 wherein the snorkel is sealed to prevent air leakage between the snorkel and the front section of the cabinet.

12. A computer server apparatus comprising:
   a plurality of disk drives disposed in a front section of a cabinet
   a fan disposed in a back section of the cabinet that draws air through a first air flow path across the disk drives in the front section;
   a snorkel defining a second air flow path circumventing the front section and providing air to the back section, wherein the snorkel is open on one side and attached to a side rail of a chassis that spans the one side and that supports the front section and back section of the server.

13. A computer server apparatus comprising:
   a plurality of disk drives disposed in a front section of a cabinet
   a fan disposed in a back section of the cabinet that draws air through a first air flow path across the disk drives in the front section;
   a snorkel defining a second air flow path circumventing the front section and providing air to the back section, wherein the snorkel is a tubular member that is attached to a side rail of a chassis that supports the front section and back section of the server.

* * * * *